US009356210B2

(12) United States Patent
Herrmann et al.

(10) Patent No.: US 9,356,210 B2
(45) Date of Patent: May 31, 2016

(54) OPTOELECTRONIC MODULE COMPRISING AN OPTICAL WAVEGUIDE AND METHOD FOR PRODUCING SAME

(71) Applicant: OSRAM Opto Semiconductors GmbH, Regensburg (DE)

(72) Inventors: Siegfried Herrmann, Neukirchen (DE); Stefan Illek, Donaustauf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/370,211

(22) PCT Filed: Jan. 11, 2013

(86) PCT No.: PCT/EP2013/050478
§ 371 (c)(1),
(2) Date: Jul. 1, 2014

(87) PCT Pub. No.: WO2013/104751
PCT Pub. Date: Jul. 18, 2013

(65) Prior Publication Data
US 2015/0048389 A1  Feb. 19, 2015

(30) Foreign Application Priority Data
Jan. 12, 2012 (DE) .......................... 10 2012 200 416

(51) Int. Cl.
*H01L 29/18* (2006.01)
*H01L 33/00* (2010.01)
(Continued)

(52) U.S. Cl.
CPC ............ *H01L 33/60* (2013.01); *G02B 27/0905* (2013.01); *G02B 27/0994* (2013.01);
(Continued)

(58) Field of Classification Search
USPC ............................................... 257/88; 438/31
IPC ......................................................... H01L 33/60
See application file for complete search history.

(56) References Cited

U.S. PATENT DOCUMENTS

| 2006/0061286 A1 | 3/2006 | Coushaine et al. |
| 2011/0205737 A1 | 8/2011 | Kong |

FOREIGN PATENT DOCUMENTS

| DE | 19549395 A1 | 10/1996 |
| DE | 102005030374 A1 | 1/2007 |

(Continued)

OTHER PUBLICATIONS

Cornelissen, H. et al., "Injecting Light of High-Power LEDs into Thin Light Guides," International Optical Design Conference 2010, Proc. of SPIE-OSA, vol. 7652, pp. 765212-1-765212-6, 2010.

*Primary Examiner* — Sonya D McCall Shepard
(74) *Attorney, Agent, or Firm* — McDermott Will & Emery LLP

(57) ABSTRACT

An optoelectronic module (202, 204, 206, 208, 210, 212, 214, 216, 218, 220, 222, 224, 226, 228, 230, 232, 234) comprises a carrier (102), at which and/or in which are arranged at least two semiconductor chips (104, 104a1, 104a2, 104b; 106, 106a1, 106a2, 106b, 106c) for emitting electromagnetic radiation (108a, 108b). An emission unit (110) for emitting electromagnetic radiation (109) from the optoelectronic module (202, 204, 206, 208, 210, 212, 214, 216, 218, 220, 222, 224, 226, 228, 230, 232, 234) is arranged on or in the carrier (102). At least one of the semiconductor chips (106, 106a1, 106a2, 106b, 106c) is spaced apart from the emission unit (110). A waveguide (112) guides the electromagnetic radiation (108a) of the at least one spaced-apart semiconductor chip (106, 106a1, 106a2, 106b, 106c) to the emission unit (110). The emission unit (110) has a coupling-out structure (114, 114a, 114b, 114c) for coupling out the electromagnetic radiation (108a) from the waveguide (112).

17 Claims, 15 Drawing Sheets

(51) Int. Cl.
*H01L 33/60* (2010.01)
*G02B 27/09* (2006.01)
*H01L 27/15* (2006.01)
*H01L 33/50* (2010.01)
*H01L 25/075* (2006.01)

(52) U.S. Cl.
CPC .............. *H01L27/15* (2013.01); *H01L 33/507* (2013.01); *H01L 25/0753* (2013.01); *H01L 2924/0002* (2013.01); *H01L 2933/0091* (2013.01)

(56) References Cited

FOREIGN PATENT DOCUMENTS

| | | |
|---|---|---|
| DE | 102006015788 A1 | 9/2007 |
| DE | 102006059980 A1 | 6/2008 |
| DE | 102009024181 A1 | 12/2010 |
| DE | 102009051746 A1 | 3/2011 |
| DE | 102010039859 A1 | 3/2012 |
| JP | 11150341 A | 6/1999 |
| WO | 2005/081319 A1 | 9/2005 |
| WO | 2007/000212 A2 | 1/2007 |
| WO | 2008/047851 A1 | 4/2008 |
| WO | WO2008/047851 * | 4/2008 |

* cited by examiner

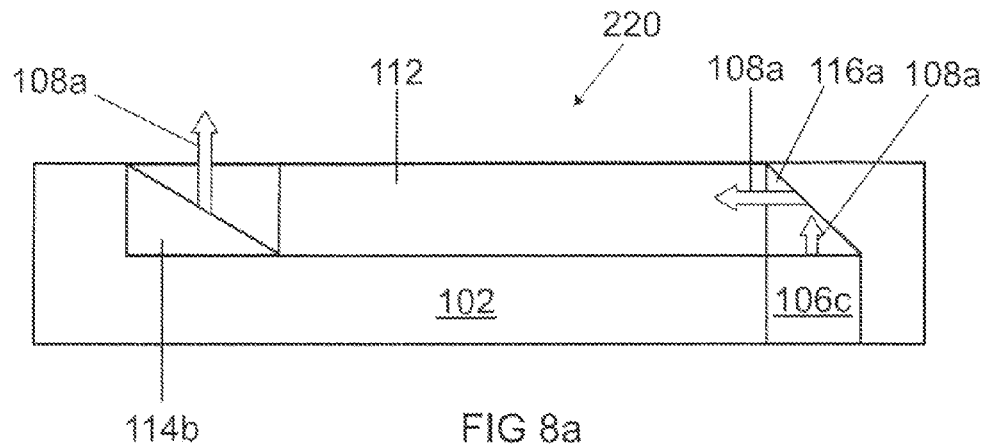
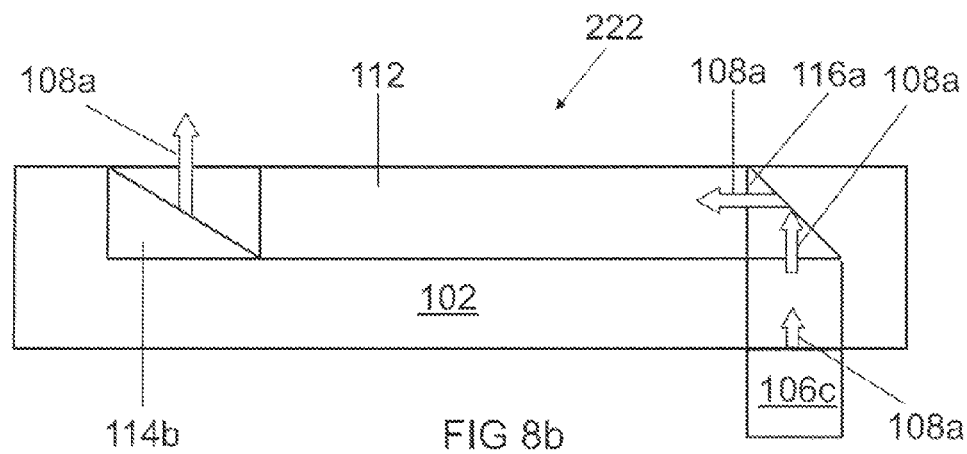
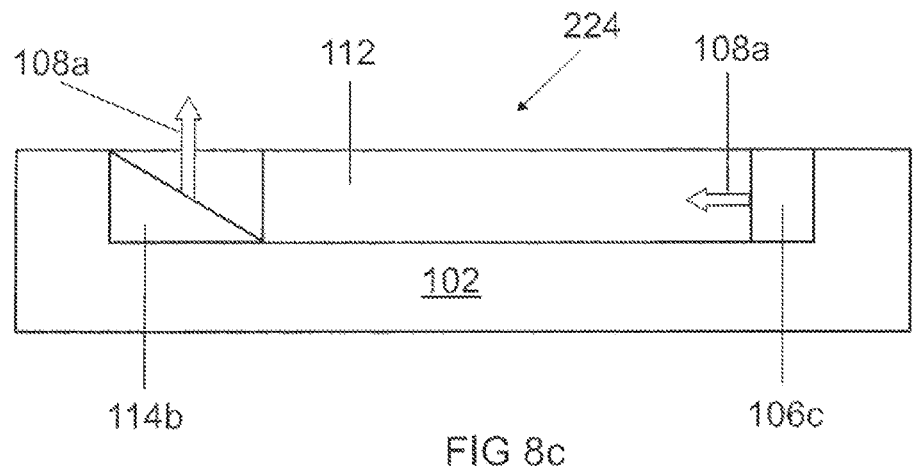

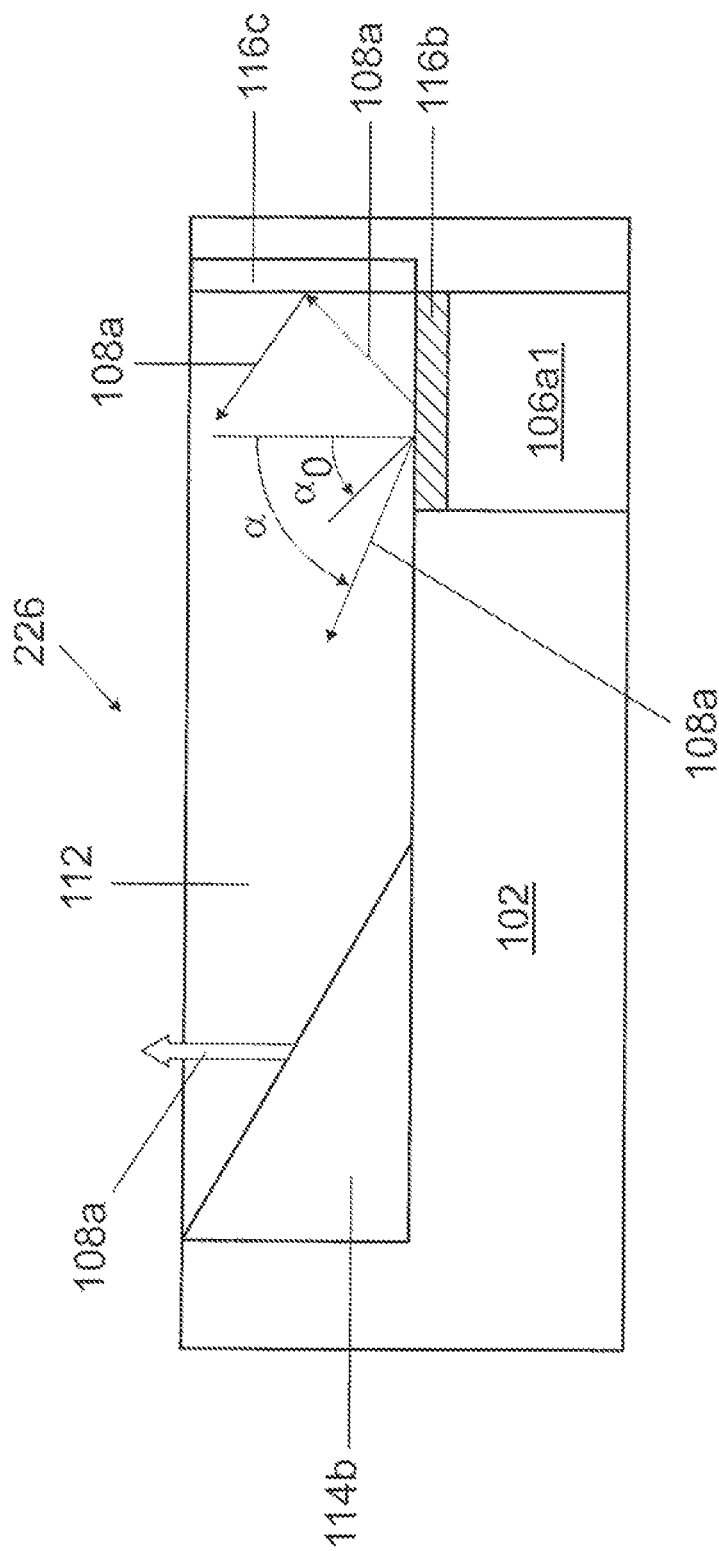

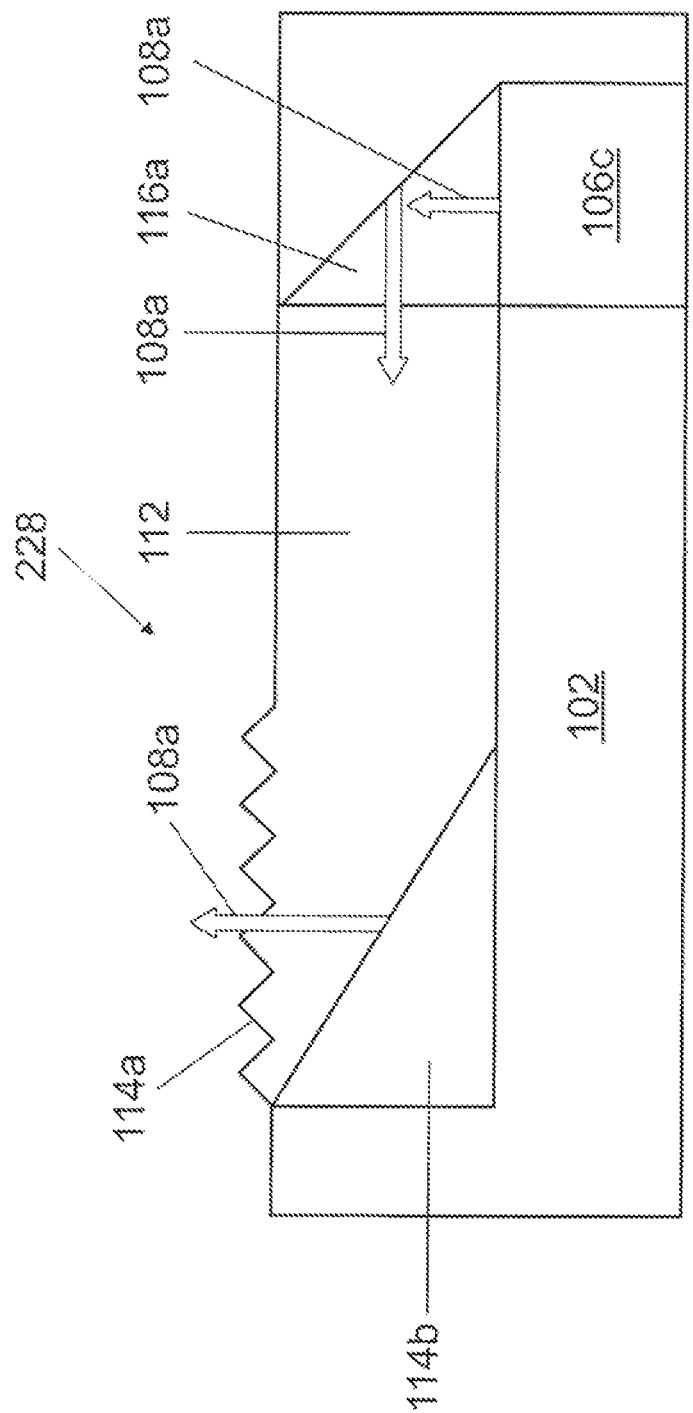

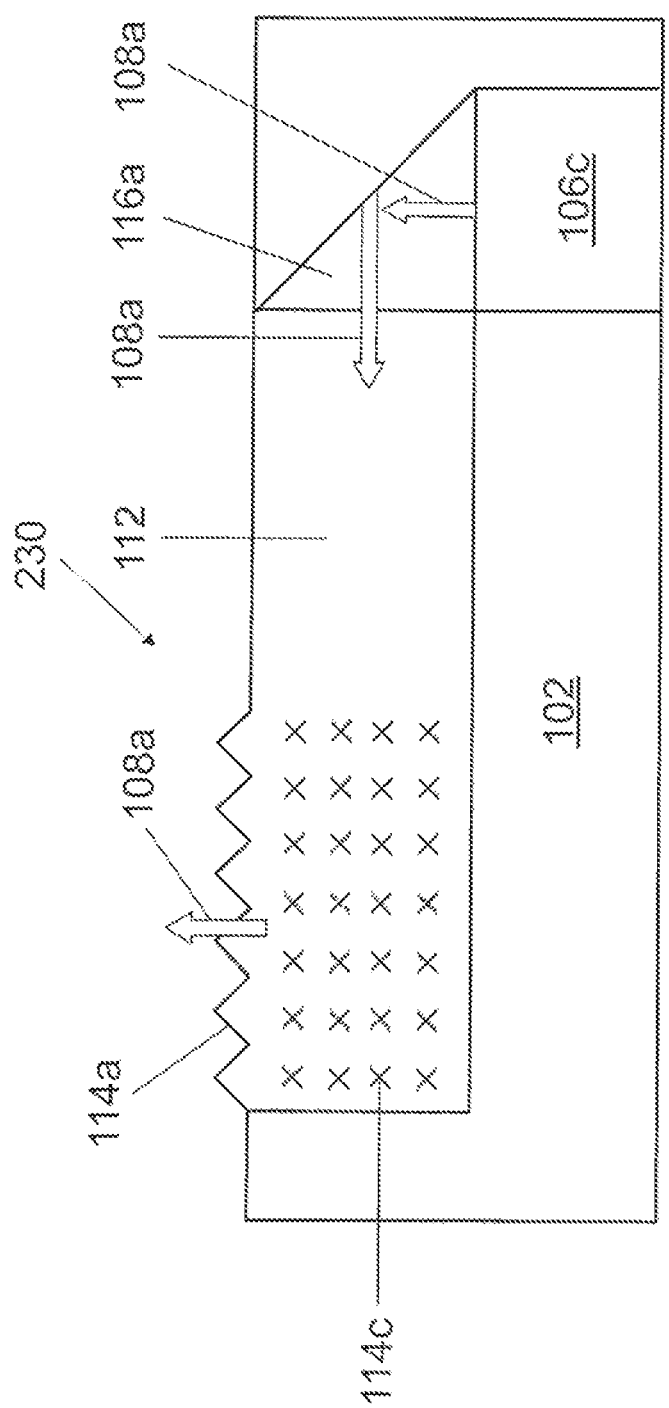

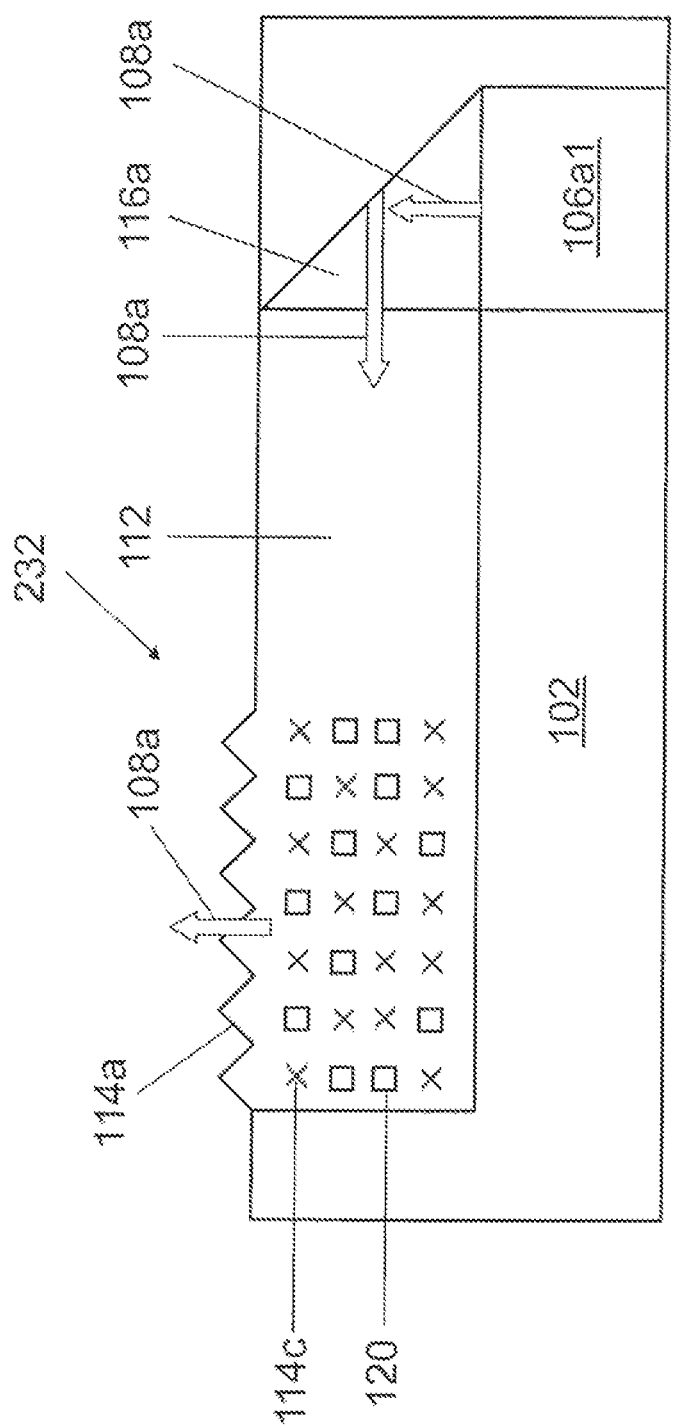

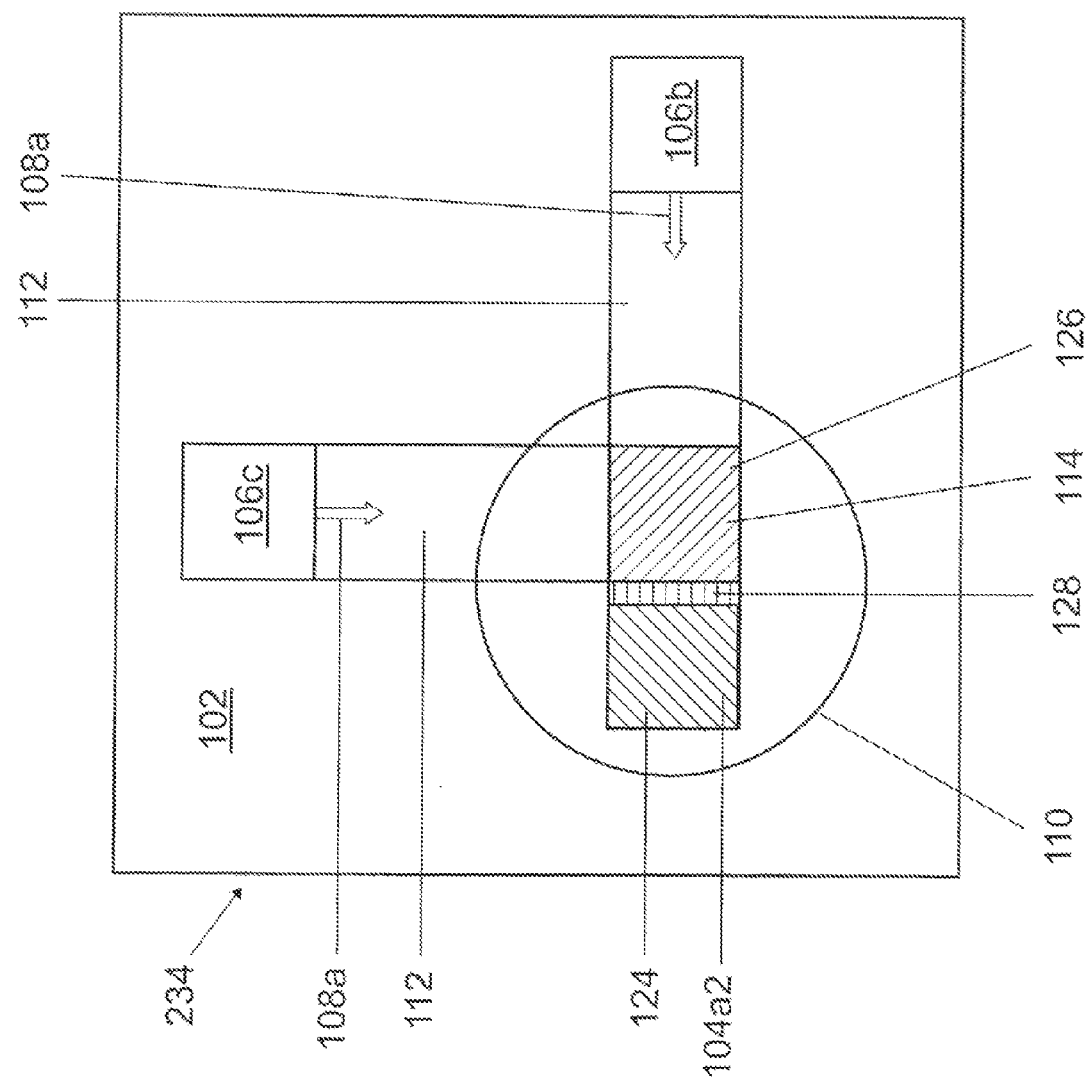

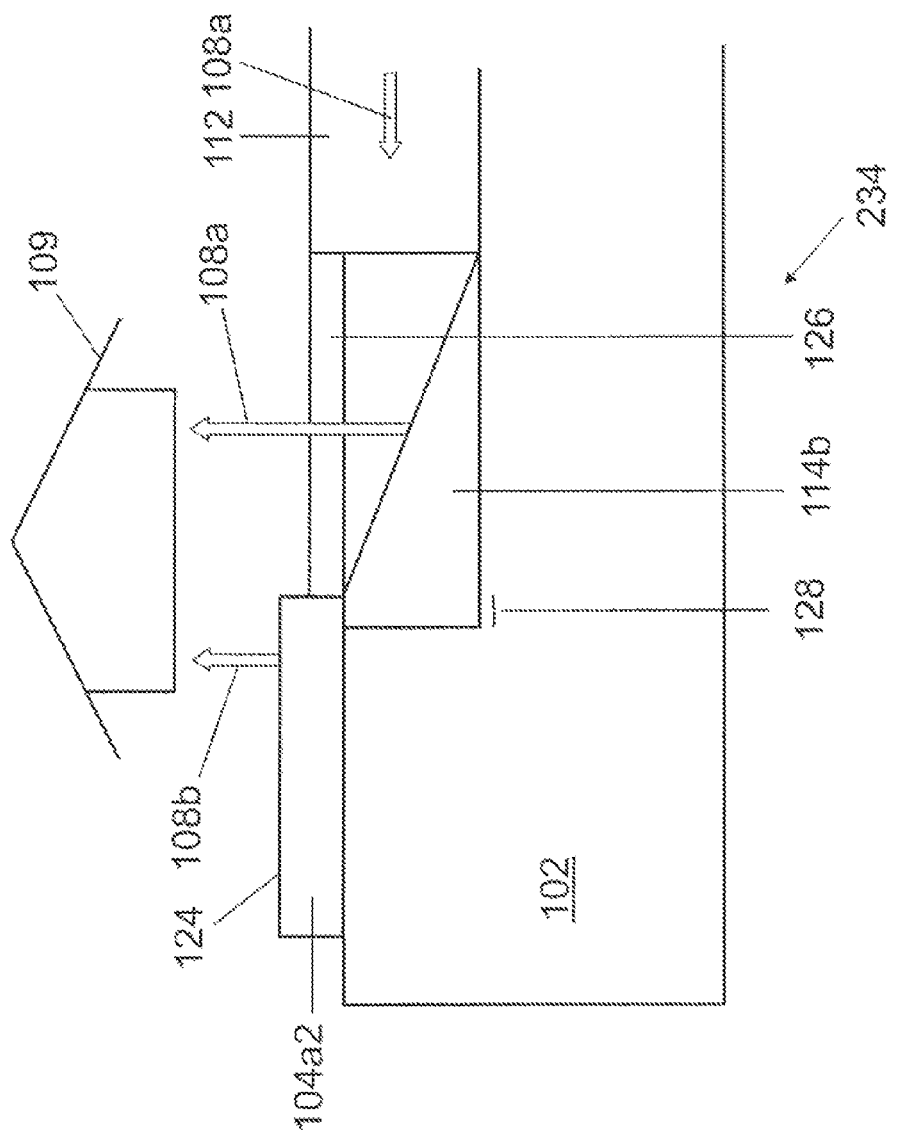

OPTOELECTRONIC MODULE COMPRISING AN OPTICAL WAVEGUIDE AND METHOD FOR PRODUCING SAME

The present invention relates to an optoelectronic module and a method for producing an optoelectronic module.

This patent application claims the priority of German Patent Application 10 2012 200 416.5, the disclosure content of which is hereby incorporated by reference.

Optoelectronic modules from the prior art can have a plurality of semiconductor chips arranged in a confined space on a carrier. This arrangement is necessary in order to achieve a compact emission area and a high radiance. However, the arrangement of the semiconductor chips in a confined space can be disadvantageous for thermal reasons, inter alia.

It is an object of the invention to specify an optoelectronic module which improves the prior art.

This object is achieved by means of an optoelectronic module according to independent patent claim 1 and by a method according to independent patent claim 18.

Developments and advantageous configurations of the optoelectronic arrangement are specified in the dependent claims.

The present invention relates to an optoelectronic module comprising a carrier and at least two semiconductor chips arranged at and/or in the carrier and serving for emitting electromagnetic radiation. An emission unit for emitting electromagnetic radiation from the optoelectronic module is arranged on or in the carrier. At least one of the semiconductor chips is spaced apart from the emission unit. A waveguide guides the electromagnetic radiation of the at least one spaced-apart semiconductor chip to the emission unit. The emission unit has a coupling-out structure for coupling out the electromagnetic radiation from the waveguide. As a result of the spacing-apart of the semiconductor chips and the use of a waveguide, the at least two semiconductor chips can be at least partly thermally decoupled. Moreover, mixed light from two or more semiconductor chips can be emitted in a concentrated fashion as electromagnetic radiation from a single location of the module, namely the emission unit. As a result, the optoelectronic module according to the invention can generate a small luminous spot with a high luminance.

In one preferred embodiment, the emission unit has at least one semiconductor chip. This is particularly advantageous since in this arrangement, too, the at least one semiconductor chip in the emission unit is thermally decoupled from the at least one spaced-apart semiconductor chip, but at the same time only one waveguide is necessary.

The optoelectronic module can be mounted on a metal plate. The metal plate advantageously has a particularly good thermal conduction. The carrier of the optoelectronic module then serves as an insulator between the semiconductor chips and the metal plate. The thinner the carrier is made, the better the heat dissipation from the semiconductor chips to the metal plate.

In one preferred embodiment, the optoelectronic module can be mounted in a reflector. This is advantageous since the light emitted by the optoelectronic module can be emitted in a forward direction by means of the reflector.

In one preferred embodiment, the carrier comprises silicon. Silicon is easily structurable. Structures in which the waveguide can be buried in a particularly simple manner can be produced by means of an etching process. Silicon has a high thermal conductivity of approximately 150 W/mK. This is advantageous since the heat of the semiconductor chips can be efficiently dissipated. Moreover, silicon can be combined well with waveguide techniques. The thickness of the silicon carrier is between 10 µm and 500 µm, preferably between 150 µm and 350 µm.

In an alternative preferred embodiment, the carrier comprises a ceramic material. Ceramic is inexpensive. The ceramic material can comprise aluminum oxide ($Al_2O_3$). Aluminum oxide has a coefficient of thermal expansion similar to that of the semiconductor chips. The thermal conductivity is approximately 30 W/mK. The ceramic carrier can be produced as so-called multilayer ceramic using multilayer technology. Said multilayer ceramic is called LTCC (Low Temperature Cofire Ceramic). In particular, electrical conduction tracks, waveguides and/or semiconductor chips can be buried into said multilayer ceramic. A multilayer ceramic consists of a plurality of layers (=sheets) that are baked together.

Structures, such as the trenches for the waveguides, are introduced into the individual layers prior to baking.

The ceramic material can comprise aluminum nitride (AlN). Aluminum nitride is particularly advantageous as carrier material owing to its very good thermal conductivity. The thermal conductivity of aluminum nitride is approximately 180 W/mK.

The ceramic material can comprise silicon nitride ($Si_3N_4$). The thermal conductivity of silicon nitride can be set between 15 and 70 W/mK. Silicon nitride ($Si_3N_4$) is mechanically very stable.

The semiconductor chips have at least one active zone that emits electromagnetic radiation. The active zones can be pn junctions, double heterostructure, multiple quantum well structure (MQW), single quantum well structure (SQW). Quantum well structure means: quantum wells (3-dim), quantum wires (2-dim) and quantum dots (1-dim).

In one preferred embodiment, the semiconductor chip can be based on a III-V compound semiconductor material. III-V compound semiconductor materials are advantageous since high internal quantum efficiencies can be obtained during the generation of radiation.

In one preferred embodiment, the semiconductor chip can comprise aluminum indium gallium nitride ($Al_xIn_yGa_{1-x-y}N$). In this case, $0 \leq x \leq 1$, $0 \leq y \leq 1$ and $x+y \leq 1$ hold true, in particular where $x \neq 1$, $y \neq 1$, $x \neq 0$ and/or $y \neq 0$. Said semiconductor chips can emit electromagnetic radiation from the ultraviolet spectral range through the blue spectral range to the green spectral range.

In a further preferred embodiment, the semiconductor chip can comprise aluminum indium gallium phosphide ($Al_xIn_yGa_{1-x-y}P$) In this case, $0 \leq x \leq 1$, $0 \leq y \leq 1$ and $x+y \leq 1$ hold true, in particular where $x \neq 1$, $y \neq 1$, $x \neq 0$ and/or $y \neq 0$. Said semiconductor chips can emit electromagnetic radiation from the red spectral range to the yellow spectral range.

In one preferred embodiment, the spaced-apart semiconductor chip is an AlInGaP semiconductor chip. The efficiency of AlInGaP semiconductor chips decreases greatly upon heating. As the temperature increases, therefore the luminous intensity of the AlInGaP semiconductor chip decreases significantly. As a result of the spacing-apart, the AlInGaP semiconductor chip is thermally decoupled from the semiconductor chips in the emission unit and from the further spaced-apart semiconductor chips. The present invention therefore makes it possible for the first time to emit the light from AlInGaP semiconductor chips in a concentrated fashion.

The waveguide can comprise at least one of the matrix materials
glass ($SiO_2$),
silicone,
polymethyl methacrylate (PMMA),
polycarbonate (PC).

The use of glass or silicone is particularly advantageous since these materials are cost-effective and simple in terms of processing.

The waveguide can have an edged or round form. The waveguide can have a thickness of between approximately 0.3 mm and 1 mm. This small thickness of the waveguide is advantageous since the height of the optoelectronic module is increased only insignificantly by such a waveguide.

In one preferred embodiment, the waveguide at least regionally can be buried in the carrier. This can be realized by a structure, in particular a trough-shaped depression, in the carrier being potted with liquid silicone and subsequently cured. The burying of the waveguide is advantageous since, as a result, the height of the optoelectronic module can be minimized and the waveguide is protected.

In one preferred embodiment, the waveguide at least regionally is arranged on the surface of the carrier. The waveguide is bonded, that is to say mechanically fixed, to the carrier. This is advantageous since mounting is particularly simple.

The optoelectronic module can have a coupling-in structure for coupling the electromagnetic radiation of the spaced-apart semiconductor chips into the waveguide. A prism can serve as a coupling-in structure. This is advantageous since, as a result of the total reflections at the glass-air interfaces of the prism, the direction of the electromagnetic radiation is deflected and the electromagnetic radiation can be efficiently coupled into the waveguide. The prism can comprise glass or silicone. The spaced-apart semiconductor chip can already be equipped with the prism beforehand.

Alternatively, a thin-film multilayer filter can serve as a coupling-in structure. The thin-film multilayer filter consists of a multiplicity, e.g. between 50 and 60, of individual layers. By way of example, $Nb_2O_5$ and $SiO_2$ can be used as materials for the individual layers. The thin-film multilayer filter is arranged directly on the radiation emission side of the spaced-apart semiconductor chip. A thin-film multilayer filter transmits only the light of the semiconductor chip which impinges on the filter at angles with respect to the normal (to the radiation emission surface) which are greater than a critical angle. Light which impinges on the filter at smaller angles than the critical angle is reflected back into the semiconductor chip and can be "recycled". The use of a thin-film multilayer filter is advantageous since the light of the spaced-apart semiconductor chip can be coupled into the waveguide without an opening or a cutout having to be introduced into the waveguide. Moreover, the filter makes it possible to minimize the loss of luminance directly above the semiconductor chip. The production and the functioning of a thin-film multilayer filter are disclosed in the publication "Injecting Light of High-Power LEDs into Thin Light Guides", Hugo J. Cornelissen et al., International Optical Design Conference 2010, SPIE-OSA/Vol. 7652. The disclosure of the above document is hereby incorporated by reference in the disclosure of the present patent application.

In one preferred embodiment, the spaced-apart semiconductor chip at least partly can be buried in the carrier. This is advantageous since, as a result, the height of the optoelectronic module is minimized and the spaced-apart semiconductor chip is protected.

In an alternative preferred embodiment, the spaced-apart semiconductor chip can be arranged on one of the two cover surfaces of the carrier. This is advantageous since the mounting of the semiconductor chip is particularly simple.

In one preferred embodiment, the semiconductor chip can be embodied as a surface emitter, in particular as a so-called thin-film chip. The use of a surface emitter is particularly advantageous since its light can be coupled into waveguides particularly efficiently. The thin-film chip is known for example from the published patent application WO2005081319A1, the disclosure of which is hereby incorporated by reference in the disclosure of the present application.

Electrical contact can be made with the semiconductor chips by means of wire bonding. In the case of light-emitting semiconductor chips which have a layer having an n-polarity and a layer having a p-polarity, contact can be made with one of the two layers via a bonding wire. In an alternative embodiment, contact can be made with both layers by means of a respective bonding wire.

In one preferred embodiment, the electrical contacts of the semiconductor layers having n-polarity and p-polarity are realized on that side of the semiconductor chip which faces the carrier. The absence of contact structures on the light emission side of the semiconductor chip enables a planar surface of the semiconductor chip. This planar surface is particularly advantageous for efficiently coupling light from the semiconductor chip into the waveguide. One example of such an embodiment is the so-called flip-chip. The flip-chip is also advantageous since, in contrast to the semiconductor chip connected by wire contact-making, the shading by the bonding wire is eliminated and no light-emitting area is lost owing to the bonding pad on the semiconductor chip.

In one preferred embodiment, the surface emitter is embodied as a so-called substrateless semiconductor chip. Substrateless means that the epitaxial layers of the semiconductor chip, in particular the light-generating epitaxial layers, are applied directly on the carrier. In other words, the germanium substrate or the silicon substrate that is used in known optoelectronic semiconductor chips is absent. The semiconductor chips can be formed from an AlInGaN material system and emit electromagnetic radiation in the blue spectral range. The epitaxial layers have a total thickness of approximately 5 µm to approximately 9 µm, preferably of approximately 6 µm. Substrateless semiconductor chips are advantageous since they increase the height of the optoelectronic module only by said 5 µm to 9 µm. Substrateless semiconductor chips are described for example in the application having the publication number DE 102009051746. The disclosure of said document is hereby incorporated by reference in the disclosure of the present application.

In one preferred embodiment, the waveguide comprises dispersed conversion particles. The conversion particles comprise at least one of the following materials:
 lanthanum-doped yttrium oxide ($Y_2O_3$—$La_2O_3$),
 yttrium aluminum garnet ($Y_3Al_5O_{12}$),
 dysprosium oxide ($Dy_2O_3$),
 aluminum oxynitride ($Al_{23}O_{27}N_5$) or
 aluminum nitride (AlN).

The conversion particles can convert, in particular, blue light into yellow light. Heat is liberated during the conversion of short-wave blue light into longer-wave yellow light. In the case of near-chip conversion, said heat can reduce the efficiency of the semiconductor chip. Therefore, it is advantageous to realize the conversion at the greatest possible distance from the temperature-sensitive spaced-apart semiconductor chip. Particularly preferably, the conversion particles are distributed homogeneously in the coupling-out region of the waveguide. The conversion particles in the coupling-out region additionally lead to a beam expansion, which enables a better emission into the surface.

In one preferred embodiment, the coupling-out structure has a roughening of the surface of the waveguide. This is advantageous since more light can leave the waveguide. The roughening of the waveguide can be produced during the production of the waveguide or subsequently. The roughening can have a pyramid structure. The pyramids can be applied to the waveguide by means of a sputtering process.

In one preferred embodiment, the coupling-out structure can have a prism. This is advantageous since, as a result of total reflection at the interfaces between prism and surroundings, the electromagnetic radiation can be deflected virtually without losses and can subsequently be coupled out from the waveguide. The light exit surface of the prism can advantageously be roughened.

In one preferred embodiment, the coupling-out structure can comprise scattering particles. The scattering particles can be distributed approximately homogeneously in the volume of the waveguide at the location of the emission unit. In other words, at the emission unit, the entire cross section of the waveguide can comprise scattering particles. The density of the scattering particles defines what proportion of the light can be coupled out from the waveguide at the emission unit. Little light is coupled out in the case of a low density of the scattering particles; a large amount of light is coupled out in the case of a high density of the scattering particles. The scattering particles occur in a concentration of between 1 and 50 percent by weight, preferably between 5 and 30 percent by weight, particularly preferably between 10 and 20 percent by weight, in the matrix material of the waveguide. Silicone, for example, is suitable as the matrix material of the waveguide.

Scattering particles can have a diffuse reflectivity (angle of incidence is usually not equal to angle of reflection) and/or a specular reflectivity (angle of incidence equal to angle of reflection). Diffusely reflective particles can comprise at least one of the following materials, which are inert and inexpensive:
  titanium dioxide ($TiO_2$),
  aluminum oxide ($Al_2O_3$) or
  zirconium oxide (ZrO)
  barium difluoride ($BaF_2$).
Specularly reflective particles can comprise at least one of the following materials:
  silver (Ag),
  aluminum (Al),
  quantum dots.
The scattering particles can advantageously have a grain size of approximately 500 nm to approximately 3 µm. The diameter of the scattering particles is therefore in the range of the wavelength of the light which is intended to be scattered.

In one preferred embodiment, as a coupling-out structure, the waveguide in the region of the emission unit can be completely reflectively coated, except at the location at which the electromagnetic radiation is intended to emerge from the waveguide.

In one preferred embodiment, the coupling-out structures presented above can be combined advantageously.

In one preferred embodiment, the coupling-out structure is integrated into the waveguide. This is advantageous since the coupling-out structure is protected and the height of the optoelectronic module is minimized.

In one preferred embodiment, the distance between the spaced-apart semiconductor chips and the emission unit is minimally double the edge length of the spaced-apart semiconductor chip, preferably minimally triple the edge length of the spaced-apart semiconductor chip. By way of example, the minimal distance can have the following values:
  given an edge length of approximately 0.5 mm, minimally approximately 1 mm, preferably minimally approximately 1.5 mm;
  given an edge length of approximately 1 mm, minimally approximately 2 mm, preferably minimally approximately 3 mm;
  given an edge length of approximately 2 mm, minimally approximately 4 mm, preferably minimally approximately 6 mm. Complying with a minimal distance is advantageous since a sufficient thermal decoupling of the at least one spaced-apart semiconductor chip from the semiconductor chips in the emission unit is possible as a result.

In one preferred embodiment, the distance between the spaced-apart semiconductor chips and the emission unit is maximally sixty times the edge length of the spaced-apart semiconductor chip, preferably maximally thirty times the edge length of the spaced-apart semiconductor chip. By way of example, the maximal distance can have the following values:
  given an edge length of approximately 0.5 mm, maximally approximately 30 mm, preferably maximally approximately 15 mm;
  given an edge length of approximately 1 mm, maximally approximately 60 mm, preferably maximally approximately 30 mm;
  given an edge length of approximately 2 mm, maximally approximately 120 mm, preferably approximately 60 mm. Complying with a maximal distance is advantageous in order to limit the dimensions of the optoelectronic module to a specific size.

In one preferred embodiment, the radiation emission surface of the semiconductor chip in the emission unit and the exit window of the waveguide can be arranged in a manner adjoining one another or even overlapping one another. This is advantageous since different-colored light can be combined in a very confined space. This can be used in projection modules. In other words, no dark region occurs between the radiation emission surface of the semiconductor chip and the exit window of the waveguide.

The present invention furthermore relates to a method for producing an optoelectronic module comprising the following steps. Firstly, a carrier is provided. Afterward, at least two semiconductor chips for emitting electromagnetic radiation are arranged at and/or in the carrier. Afterward, an emission unit for emitting electromagnetic radiation from the optoelectronic module is arranged on or in the carrier. At least one of the semiconductor chips is arranged in a manner spaced apart from the emission unit. Afterward, a waveguide is arranged on and/or in the carrier. The waveguide guides the electromagnetic radiation of the at least one spaced-apart semiconductor chip to the emission unit. A coupling-out structure for coupling out the electromagnetic radiation from the waveguide is arranged in the emission unit. This method is advantageous since it is thereby possible to produce an optoelectronic module in which the temperature-sensitive semiconductor chips can be thermally decoupled from the emission unit.

Various exemplary embodiments are explained in greater detail below with reference to the drawings. Elements that are identical, of identical type or act identically are provided with the same reference signs in the figures. The figures and the size relationships of the elements illustrated in the figures among one another should not be regarded as to scale. Moreover, individual elements may be illustrated with an exaggerated large or reduced size in order to enable better illustration and in order to afford a better understanding.

FIG. 8a shows a tenth exemplary embodiment of an optoelectronic module according to the invention in sectional view;

FIG. 8b shows an eleventh exemplary embodiment of an optoelectronic module according to the invention in sectional view;

FIG. 8c shows a twelfth exemplary embodiment of an optoelectronic module according to the invention in sectional view;

FIG. 8d shows a thirteenth exemplary embodiment of an optoelectronic module according to the invention in sectional view;

FIG. 9a shows a fourteenth exemplary embodiment of an optoelectronic module according to the invention in sectional view;

FIG. 9b shows a fifteenth exemplary embodiment of an optoelectronic module according to the invention in sectional view;

FIG. 9c shows a sixteenth exemplary embodiment of an optoelectronic module according to the invention in sectional view;

FIG. 10a shows a seventeenth exemplary embodiment of an optoelectronic module according to the invention in plan view;

FIG. 10b shows an excerpt from the optoelectronic module according to the invention from FIG. 10a in sectional view.

Figure 1A:
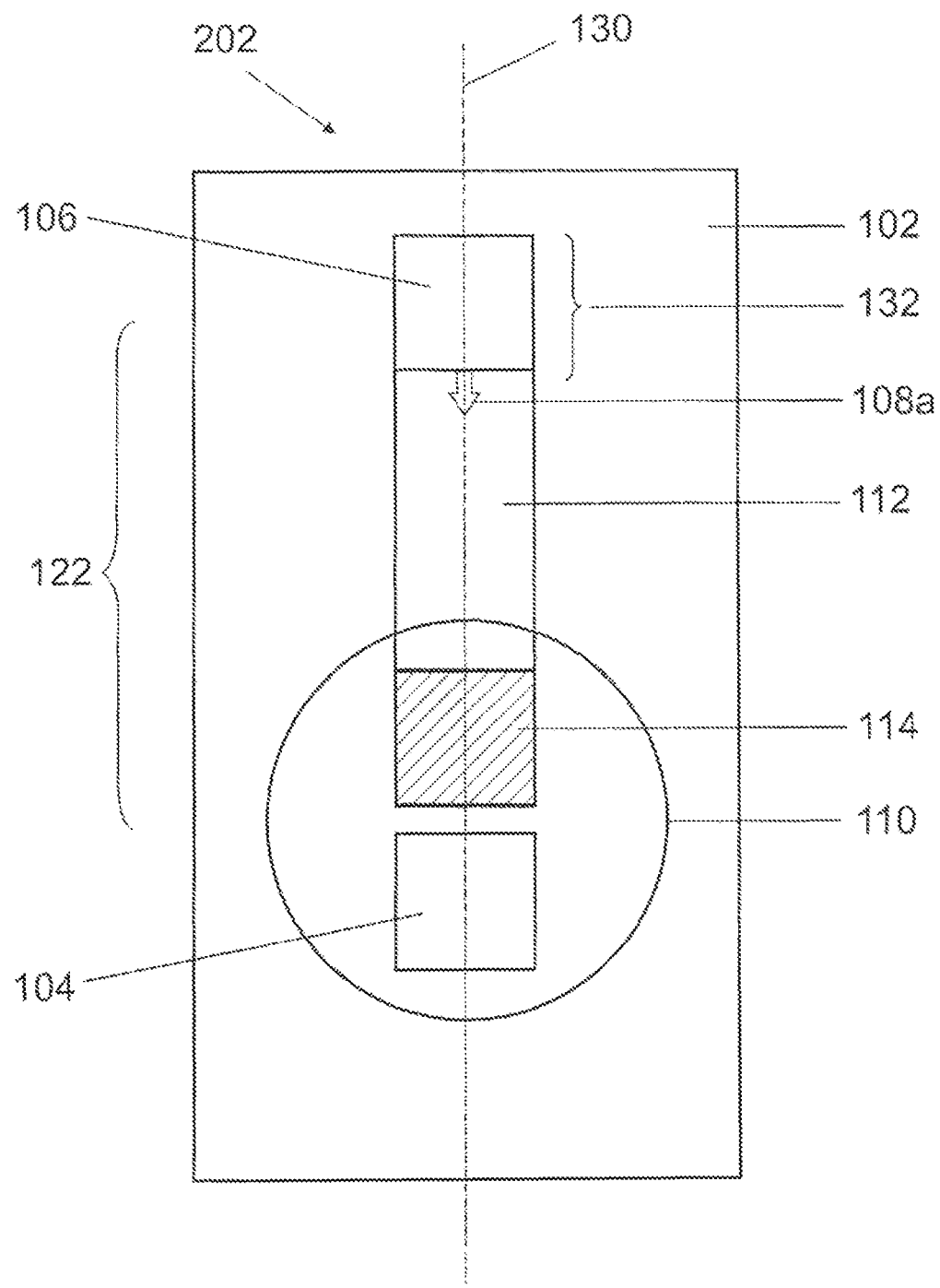
FIG. 1a shows a first exemplary embodiment of an optoelectronic module according to the invention in plan view.

FIG. 1a shows a first exemplary embodiment of an optoelectronic module 202 according to the invention in plan view. Two semiconductor chips 104, 106 for emitting electromagnetic radiation 108b (not shown in FIG. 1a), 108a are arranged on a carrier 102. An emission unit 110 for emitting electromagnetic radiation 109 (not illustrated in FIG. 1a) from the optoelectronic module 202 is arranged on or in the carrier 102. The semiconductor chip 106 is spaced apart from the emission unit 110. A waveguide 112 guides the electromagnetic radiation 108a of the spaced-apart semiconductor chip 106 to the emission unit 110. The emission unit 110 has a coupling-out structure 114 for coupling out the electromagnetic radiation 108a from the waveguide 112. The emission unit 110 has a semiconductor chip 104. The carrier 102 comprises silicon or a ceramic material. The distance 122 between the spaced-apart semiconductor chip 106 and the emission unit 110 is minimally double the edge length 132 of the spaced-apart semiconductor chip 106, preferably minimally triple the edge length 132 of the spaced-apart semiconductor chip 106. Given an edge length 132 of approximately 1 mm, the distance is minimally approximately 2 mm, preferably minimally approximately 3 mm.

The distance 122 between the spaced-apart semiconductor chip 106 and the emission unit 110 is maximally sixty times the edge length 132 of the spaced-apart semiconductor chip 106, preferably maximally thirty times the edge length 132 of the spaced-apart semiconductor chip 106. Given an edge length 132 of approximately 1 mm, the distance 122 is maximally approximately 60 mm, preferably maximally approximately 30 mm. A sectional line 130 is illustrated, which cuts through the optoelectronic module 202 centrally along the longitudinal axis thereof. The width of the waveguide 112 (measured perpendicularly to the sectional line 130) is, for example, between one and three times the edge length 132 of the spaced-apart semiconductor chip 106. The coupling-out structure 114 can have, for example, a square or rectangular form. The areal dimensioning of the coupling-out structure 114 can have a width and a length of in each case one edge length 132 of the spaced-apart semiconductor chip 106 up to a width and a length of in each case four edge lengths 132 of the spaced-apart semiconductor chip 106. By way of example, the coupling-out structure 114 can have a width of 2 and a length of 3 edge lengths 132 of the spaced-apart semiconductor chip 106.

Figure 1B:
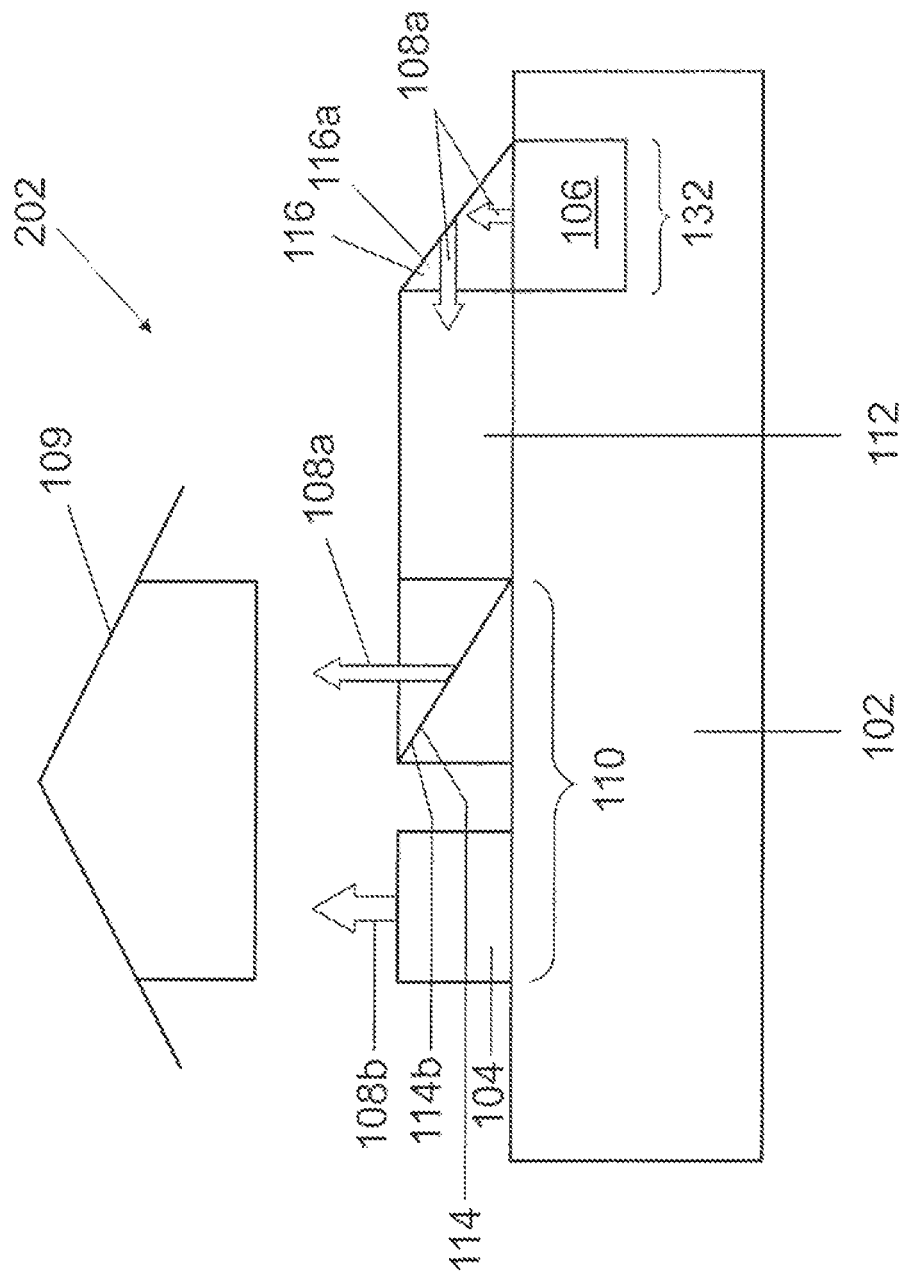
FIG. 1b shows the exemplary embodiment of the optoelectronic module according to the invention from FIG. 1a in sectional view.

FIG. 1b shows the exemplary embodiment of the optoelectronic module according to the invention from FIG. 1a in sectional view along the sectional line 130. The spaced-apart semiconductor chip 106 is completely buried in the carrier 102. A prism 116a is provided as a coupling-in structure 116. The prism 116a couples the electromagnetic radiation 108a of the spaced-apart semiconductor chip 106 into the waveguide 112. The waveguide 112 guides the electromagnetic radiation 108a to the coupling-out structure 114, which is part of the emission unit 110. A prism 114b is provided as the coupling-out structure 114. In addition, a semiconductor chip 104 that emits electromagnetic radiation 108b is arranged in the emission unit 110. Electromagnetic radiation 109 in the form of mixed light is emitted from the emission unit 110, said mixed light leaving the optoelectronic module 202. The mixed light 109 is composed of the electromagnetic radiation 108a of the spaced-apart semiconductor chip 106 and the electromagnetic radiation 108b of the semiconductor chip 104 in the emission unit 110. The coupling-in structure 116, the waveguide 112 and the coupling-out structure 114 are arranged on the surface of the carrier 102. The semiconductor chip 104 in the emission unit 110 is also arranged on the surface of the carrier 102.

For the exemplary embodiments in FIGS. 1a and 1b, and also for all of the following exemplary embodiments, it holds true that surface emitters are particularly well suited as spaced-apart semiconductor chips 106 owing to the necessary, efficient coupling of the electromagnetic radiation 108a into the waveguide 112.

Figure 2:
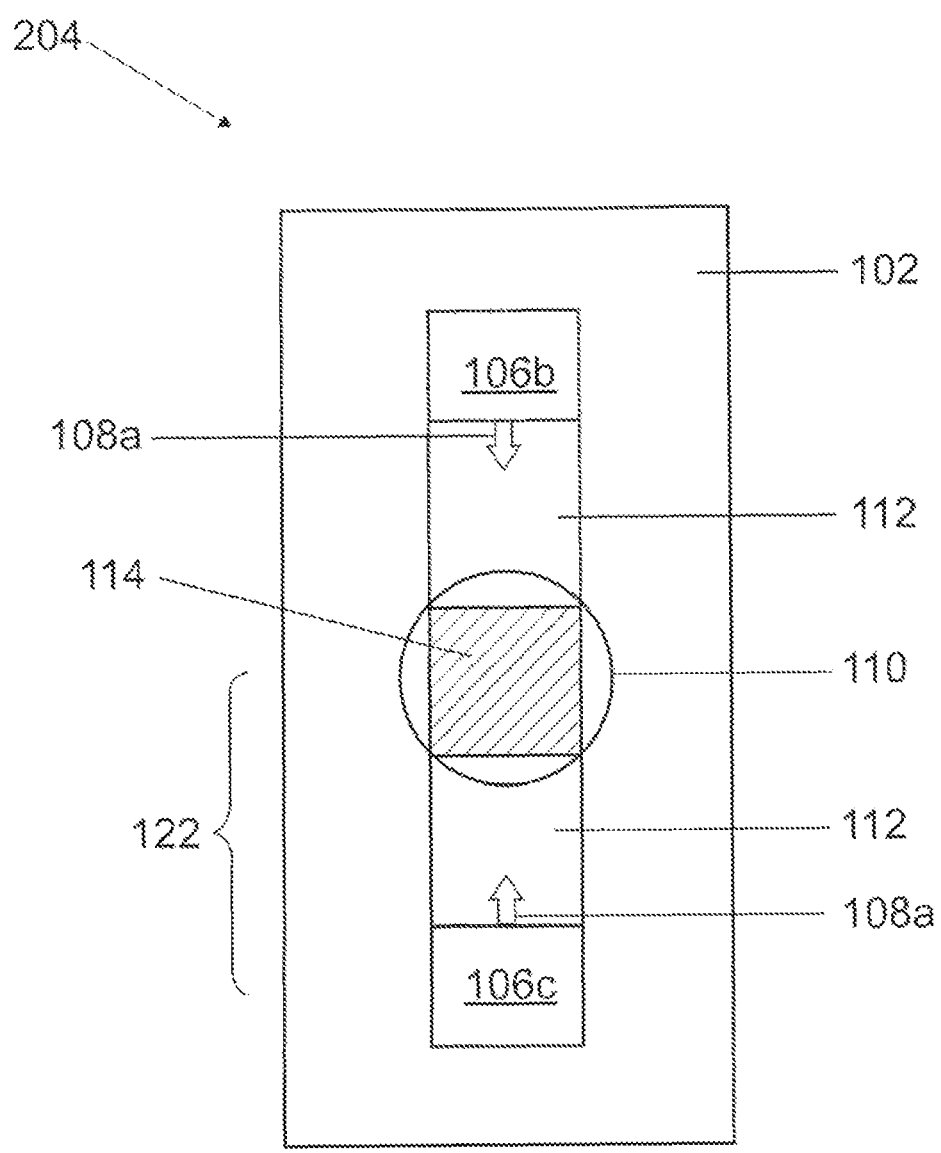
FIG. 2 shows a second exemplary embodiment of an optoelectronic module according to the invention in plan view.

FIG. 2 shows a second exemplary embodiment of an optoelectronic module 204 according to the invention in plan view. Two semiconductor chips 106 spaced apart from the emission unit 110 are provided. In the present case, a green spaced-apart semiconductor chip 106b and a red spaced-apart semiconductor chip 106c are involved. The light of the spaced-apart semiconductor chips 106b, 106c is guided in each case via a respective waveguide 112 to the emission unit 110. No semiconductor chip is arranged in the emission unit 110. Consequently, the emission unit 110 coincides with the coupling-out structure 114. The emission unit 110 emits the mixed light 109 (not illustrated in FIG. 2) comprising green light and red light from the optoelectronic module 204.

Figure 3:
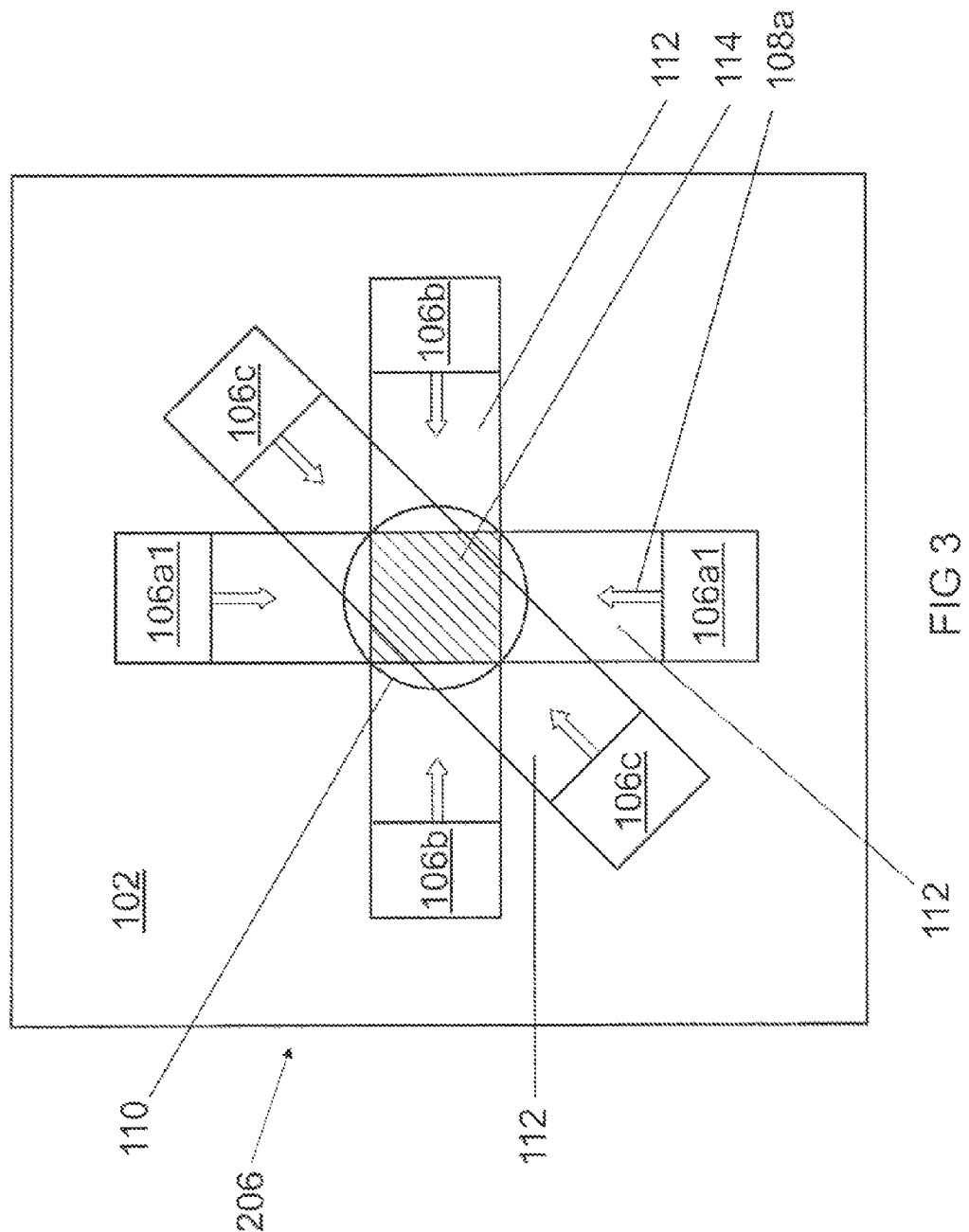
FIG. 3 shows a third exemplary embodiment of an optoelectronic module according to the invention in plan view.

FIG. 3 shows a third exemplary embodiment of an optoelectronic module 206 according to the invention in plan view. All semiconductor chips 106a1, 106b, 106c are spaced apart from the emission unit 110. In each case two red spaced-apart semiconductor chips 106c, green spaced-apart semiconductor chips 106b and blue spaced-apart semiconductor chips 106a1 are provided. The electromagnetic radiation 108a of all the spaced-apart semiconductor chips 106a1, 106b, 106c is guided via waveguides 112 to a single emission unit 110. Such an optoelectronic module 206 is suitable for point light sources which emit mixed light 109 (not illustrated in FIG. 3) comprising red, green and blue light, that is to say substantially white mixed light.

Figure 4:
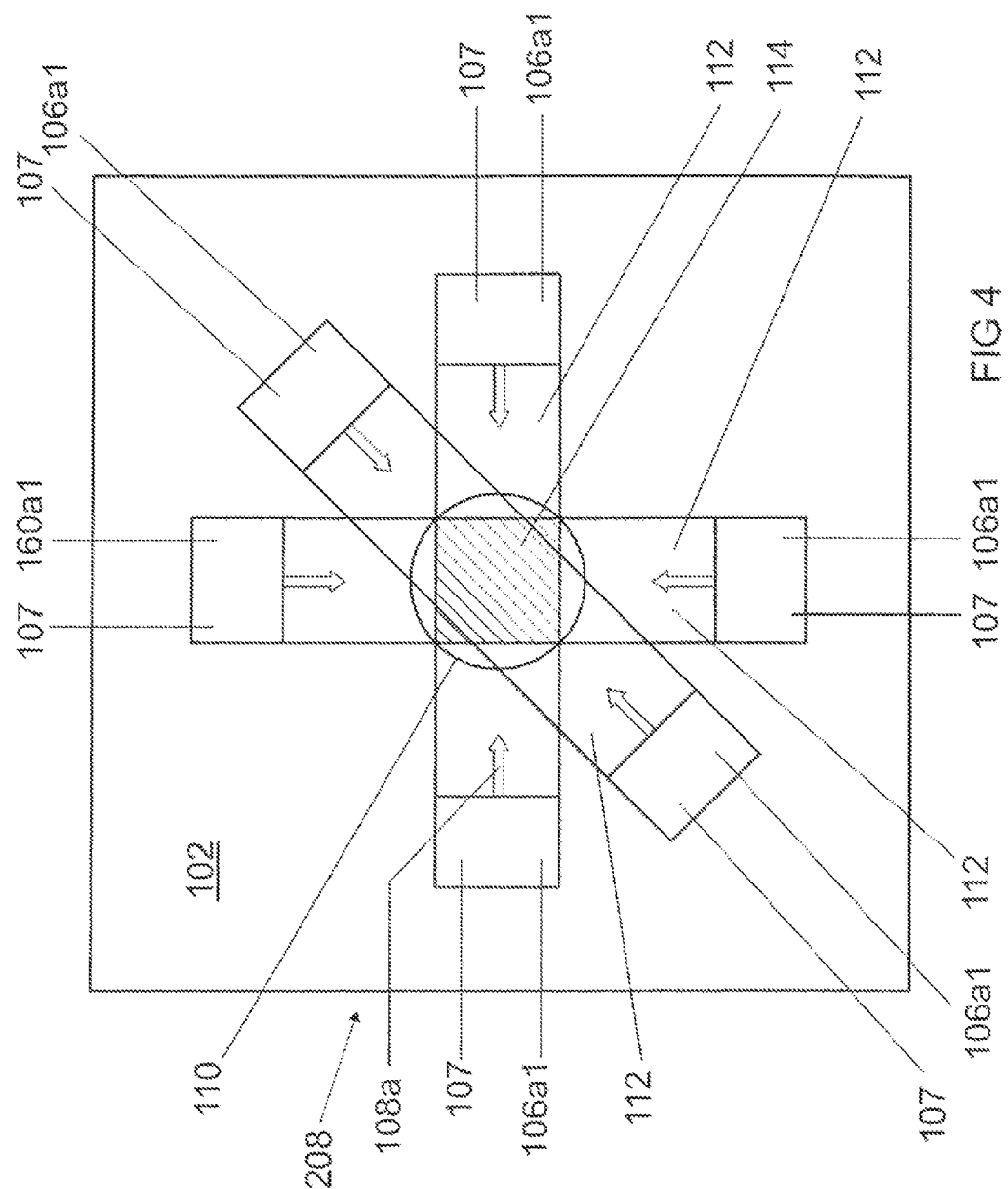
FIG. 4 shows a fourth exemplary embodiment of an optoelectronic module according to the invention in plan view.

FIG. 4 shows a fourth exemplary embodiment of an optoelectronic module 208 according to the invention in plan view. Six white LEDs 107 are shown. The white LEDs 107 comprise spaced-apart blue semiconductor chips 106a1 that emit electromagnetic radiation in the blue spectral range. Part of the blue radiation is converted into the yellow spectral range by converter materials (not illustrated in FIG. 4) in direct proximity to the blue semiconductor chips 106a1. The mixed light comprising blue and yellow light can be combined to form white light. The emission unit 110 emits white light of high intensity as a point light source.

Figure 5:
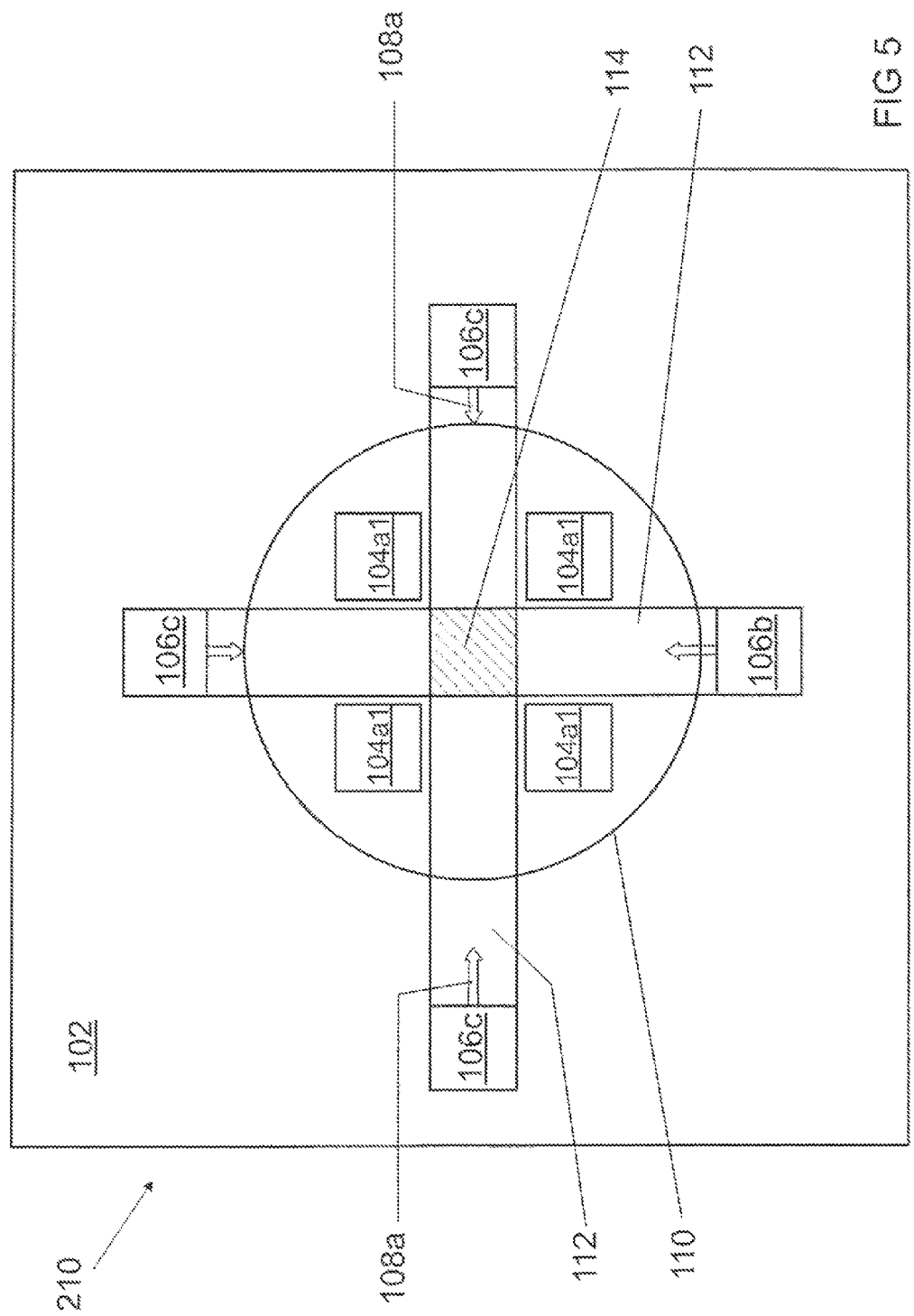
FIG. 5 shows a fifth exemplary embodiment of an optoelectronic module according to the invention in plan view.

FIG. 5 shows a fifth exemplary embodiment of an optoelectronic module 210 according to the invention in plan view. As spaced-apart semiconductor chips, provision is made of three semiconductor chips 106c that emit electromagnetic radiation 108a in the red spectral range and one semiconductor chip 106b that emits electromagnetic radiation 108a in the green spectral range. The electromagnetic radiation 108a of the spaced-apart semiconductor chips 106b, 106c is guided via waveguides 112 to the central emission unit 110 and is coupled out from the waveguides 112 via the coupling-out structure 114. Four semiconductor chips 104a1 that each emit electromagnetic radiation 108b (not illustrated in FIG. 5) in the blue spectral range are arranged within the emission unit 110. The blue semiconductor chips 104a1 in the emission unit 110 can be sapphire volume emitters, as known for example from the patent specification DE102006015788A1. Blue surface emitters 104a1 are preferably used, however. The semiconductor chips that emit in the blue and green spectral range can be based on the AlInGaN material system. The semiconductor chips that emit in the red spectral range can be based on the AlInGaP material system. It is particularly advantageous for the thermally particularly sensitive AlInGaP semiconductor chips 106c to be arranged at a distance from the emission unit 110, in particular from the four blue semiconductor chips 104a1. This spacing-apart prevents, inter alia, the efficiency of the red semiconductor chips 106c from being adversely influenced. This optoelectronic module 210 serves for generating white mixed light 109 (not illustrated in FIG. 5).

Figure 6:
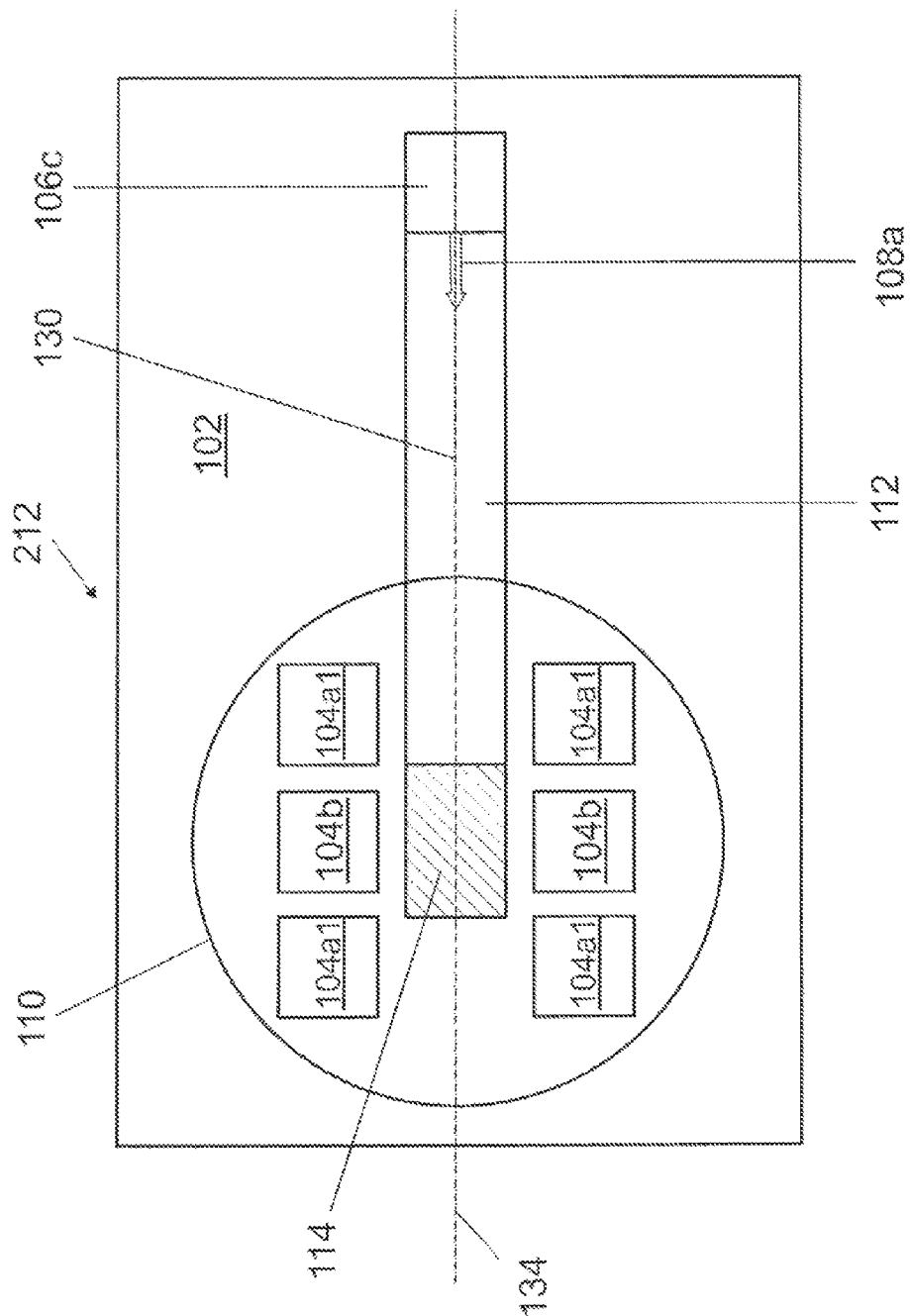
FIG. 6 shows a sixth exemplary embodiment of an optoelectronic module according to the invention in plan view.

FIG. 6 shows a sixth exemplary embodiment of an optoelectronic module 212 according to the invention in plan view. Four blue semiconductor chips 104a1 and two green semiconductor chips 104b are arranged around the coupling-out structure 114 within the emission unit 110. One red semiconductor chip 106c is spaced apart from the emission unit. This optoelectronic module 212 serves for generating white mixed light 109 (not illustrated in FIG. 6). The sectional views in FIGS. 7a, 7b, 8a, 8b and 8c are illustrated along the sectional axis 134.

Figure 7A:
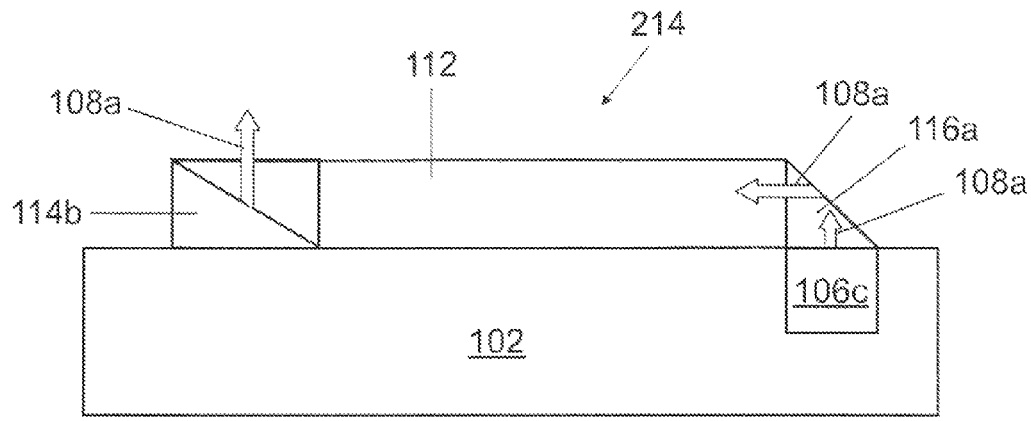
FIG. 7a shows a seventh exemplary embodiment of an optoelectronic module according to the invention in sectional view.

FIG. 7a shows a seventh exemplary embodiment of an optoelectronic module 214 according to the invention in sectional view. The spaced-apart red semiconductor chip 106c is completely buried in the carrier 102. A prism 116a is provided as a coupling-in structure into the waveguide 112. The prism 116a serves for deflecting the electromagnetic radiation 108a of the spaced-apart red semiconductor chip 106c. The waveguide 112 is arranged on the carrier 102. A prism 114b is provided as the coupling-out structure.

Figure 7B:
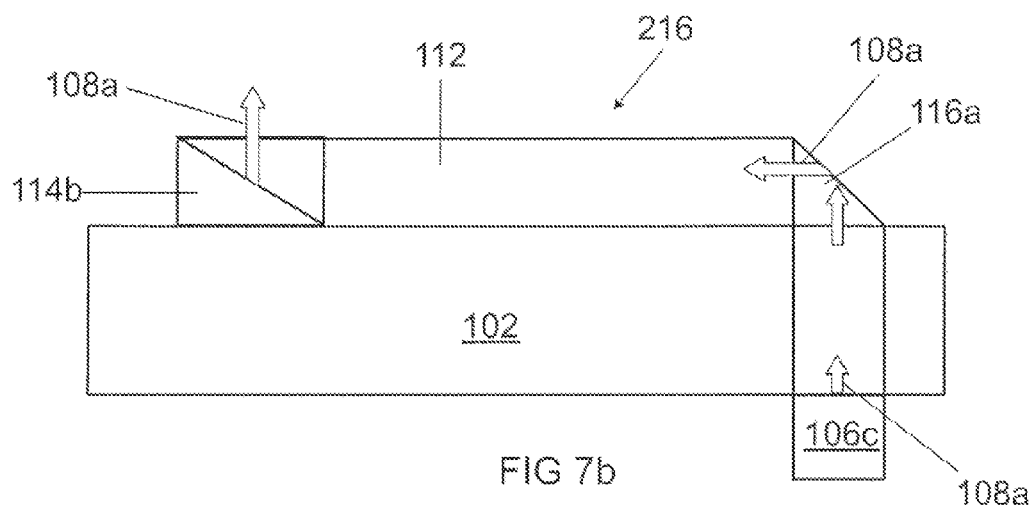
FIG. 7b shows an eighth exemplary embodiment of an optoelectronic module according to the invention in sectional view.

FIG. 7b shows an eighth exemplary embodiment of an optoelectronic module 216 according to the invention in sectional view. The spaced-apart red semiconductor chip 106c is arranged on that side of the carrier 102 which is situated opposite the side having the coupling-in structure in the form of a prism 116a. A cutout has to be provided in the carrier 102, through which cutout the electromagnetic radiation 108a of the spaced-apart semiconductor chip 106c can be guided to the prism 116a. Otherwise, the present exemplary embodiment corresponds to the exemplary embodiment in FIG. 7a.

Figure 7C:
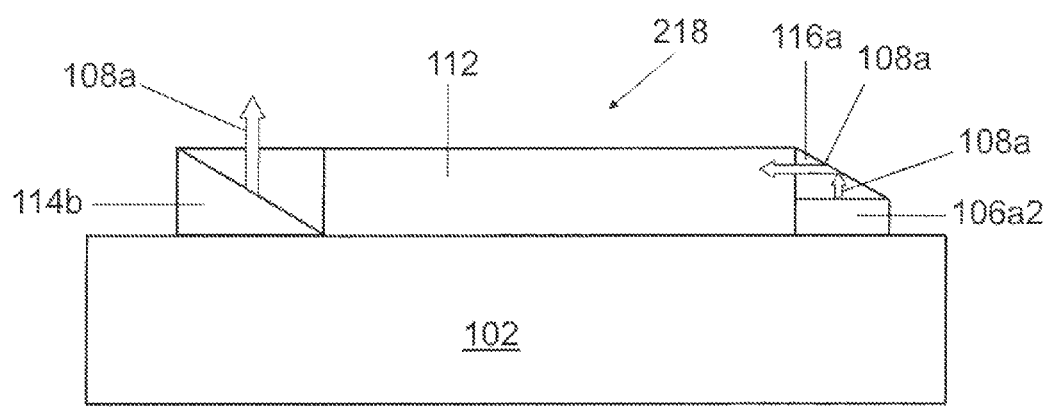
FIG. 7c shows a ninth exemplary embodiment of an optoelectronic module according to the invention in sectional view.

FIG. 7c shows a ninth exemplary embodiment of an optoelectronic module 218 according to the invention in sectional view. The spaced-apart semiconductor chip is a substrateless blue semiconductor chip 106a2. Owing to its small height above the carrier 102 of only approximately 6 µm, the substrateless semiconductor chip 106a2 does not have to be buried in the carrier 102. Otherwise, the present exemplary embodiment corresponds to the exemplary embodiments in FIGS. 7a and 7b.

FIG. 8a shows a tenth exemplary embodiment of an optoelectronic module 220 according to the invention in sectional view. The spaced-apart red semiconductor chip 106c, the prism 116a of the coupling-in structure, the waveguide 112 and the prism 114b of the coupling-out structure are completely buried in the carrier 102. The prisms 116a, 114b deflect the electromagnetic radiation 108a.

FIG. 8b shows an eleventh exemplary embodiment of an optoelectronic module 222 according to the invention in sectional view. The spaced-apart red semiconductor chip 106c is not buried in the carrier 102. The semiconductor chip 106c is arranged on that surface of the carrier 102 which is situated opposite the waveguide 112. Otherwise, the present exemplary embodiment corresponds to the exemplary embodiment in FIG. 8a.

FIG. 8c shows a twelfth exemplary embodiment of an optoelectronic module 224 according to the invention in sectional view. The spaced-apart red semiconductor chip 106c is completely buried in the carrier 102. A coupling-in structure 116 can be dispensed with. The red semiconductor chip 106c is buried in the carrier 102 such that its electromagnetic radiation 108a can be coupled directly into the waveguide 112. Otherwise, the present exemplary embodiment corresponds to the exemplary embodiments in FIGS. 8a and 8b.

FIG. 8d shows a thirteenth exemplary embodiment of an optoelectronic module 226 according to the invention in sectional view. The spaced-apart blue semiconductor chip 106a1 is completely buried in the carrier 102. As a coupling-in structure, a thin-film multilayer filter 116b is applied on the blue semiconductor chip 106a1. Said filter 116b has the effect that only electromagnetic radiation 108a having an emission angle α with respect to the normal that is greater than a critical angle $α_0$ is transmitted. By way of example, by means of a suitable choice of the number and the materials of the individual layers of the filter, the critical angle $α_0$ for blue light can be set to approximately 40°. This filter property is particularly advantageous for coupling electromagnetic radiation 108a into the waveguide 112. The luminance in the waveguide 112 can be increased further by that end of the waveguide 112 which is situated opposite the coupling-out structure 114, in particular the prism 114b, being provided with a mirror 116c. A prism 116a for coupling in and deflecting the electromagnetic radiation 108a can be dispensed with.

FIG. 9a shows a fourteenth exemplary embodiment of an optoelectronic module 228 according to the invention in sectional view. The spaced-apart red semiconductor chip 106c, the prism 116a for coupling the electromagnetic radiation 108a into the waveguide 112 and the prism 114b for coupling out the electromagnetic radiation 108a from the waveguide 112 are completely buried in the carrier 102. In addition to the prism 114b, the waveguide 112 has a roughening 114a at its surface as a coupling-out structure. The waveguide 112 is roughened only in the region of the emission unit 110. The roughening 114a can have a pyramid structure. The coupling-out structure is integrated into the waveguide 112.

FIG. 9b shows a fifteenth exemplary embodiment of an optoelectronic module 230 according to the invention in sectional view. The coupling-out structure in the waveguide 112 has a roughening 114a and scattering particles 114c. The scattering particles 114c are distributed approximately homogeneously over the entire cross section of the waveguide 112. $TiO_2$ particles can be used as scattering particles 114c. A prism 114b as coupling-out structure can be dispensed with. Otherwise, the present exemplary embodiment corresponds to the exemplary embodiment in FIG. 9a.

FIG. 9c shows a sixteenth exemplary embodiment of an optoelectronic module 232 according to the invention in sectional view. The spaced-apart semiconductor chip 106a1 emits electromagnetic radiation 108a in the blue spectral range. At the location of the coupling-out structure 114, in addition to the scattering particles 114c, conversion particles 120 are introduced into the waveguide 112. Said conversion particles 120 can convert part of the electromagnetic radiation from the blue spectral range into the yellow spectral range. The mixed light can produce white light. The heat that arises during the wavelength conversion in the conversion particles 120 can be emitted to the surroundings far away from the spaced-apart semiconductor chip 106a1. The efficiency of the spaced-apart semiconductor chip 106a1 is not adversely influenced as a result.

FIG. 10a shows a seventeenth exemplary embodiment of an optoelectronic module 234 according to the invention in plan view. In each case one red semiconductor chip 106c and one green semiconductor chip 106b are provided as spaced-apart semiconductor chips. The electromagnetic radiation 108a is guided to the coupling-out structure 114 and emitted through an exit window 126 of the waveguide 112. In addition, a blue substrateless semiconductor chip 104a2 is arranged in the emission unit 110. The blue light is emitted through the radiation emission surface 124 of the blue substrateless semiconductor chip 104a2. The radiation emission surface 124 and the exit window 126 form an overlap 128. In an exemplary embodiment which is not shown, the radiation emission surface 124 and the exit window 126 directly adjoin one another, but do not overlap one another.

FIG. 10b shows an excerpt from the optoelectronic module 234 according to the invention from FIG. 10a in sectional view. The illustration substantially shows the emission unit 110 of the optoelectronic module 234 from FIG. 10a. The coupling-out structure is a prism 114b. The waveguide 112 is covered by a light-transmissive exit window 126 in the emission unit 110. Owing to its small thickness of only approximately 6 µm, the substrateless blue semiconductor chip 104a2 can be arranged on the surface of the carrier 102 in the emission unit 110. As a result of the overlap 128 of the radiation emission surface 124 of the blue semiconductor chip 104a2 and the exit window 126 of the waveguide 112, mixed light 109 can be emitted by the optoelectronic module 234, said mixed light being particularly well suited to projection purposes owing to its spatial and spectral homogeneity.

One exemplary embodiment of a method for producing an optoelectronic module is presented below. Firstly, a carrier is provided. Afterward, at least two semiconductor chips for emitting electromagnetic radiation are arranged at and/or in the carrier. Afterward, an emission unit for emitting electromagnetic radiation from the optoelectronic module is arranged on or in the carrier. At least one of the semiconductor chips is arranged in a manner spaced apart from the emission unit. Afterward, a waveguide is arranged on and/or in the carrier. The waveguide guides the electromagnetic radiation of the at least one spaced-apart semiconductor chip to the emission unit. A coupling-out structure for coupling out the electromagnetic radiation from the waveguide is arranged in the emission unit.

The optoelectronic module and the method for producing an optoelectronic module have been described on the basis of some exemplary embodiments in order to elucidate the underlying concept. In this case, the exemplary embodiments are not restricted to specific combinations of features. Even if some features and configurations have been described only in connection with one particular exemplary embodiment or individual exemplary embodiments, they can in each case be combined with other features from other exemplary embodiments. It is likewise possible, in exemplary embodiments, to omit or add individual illustrated features or particular configurations, insofar as the general technical teaching is still realized.

Even if the steps of the method for producing an optoelectronic module are described in a specific order, nevertheless it goes without saying that each of the methods described in this disclosure can be carried out in any other practical order, wherein method steps can also be omitted or added, insofar as no departure is made from the fundamental concept of the technical teaching described.

LIST OF REFERENCE SIGNS

102 Carrier
104 Semiconductor chip in the emission unit
104a1 Blue semiconductor chip
104a2 Blue semiconductor chip, substrateless
104b Green semiconductor chip
106 Spaced-apart semiconductor chip
106a1 Blue semiconductor chip
106a2 Blue semiconductor chip, substrateless
106b Green semiconductor chip
106c Red semiconductor chip
107 White LED
108a Electromagnetic radiation of the spaced-apart semiconductor chip 106
108b Electromagnetic radiation of the semiconductor chip 104 in the emission unit 110
109 Electromagnetic radiation, mixed light
110 Emission unit
112 Waveguide
114 Coupling-out structure
114a Roughening
114b Prism
114c Scattering particles
116 Coupling-in structure
116a Prism
116b Thin-film multilayer filter
116c Mirror
120 Conversion particles
122 Distance between the spaced-apart semiconductor chip (106) and the emission unit (110)

124 Radiation emission surface of the semiconductor chip 104
126 Exit window of the waveguide 112
128 Overlap of radiation emission surface 124 and exit window 126
130 Sectional line
132 Edge length of the spaced-apart semiconductor chip 106
134 Sectional line
202 to 234 Optoelectronic module
α Emission angle at the thin-film multilayer filter 116b
$α_0$ Critical angle for transmission through the thin-film multilayer filter 116b

The invention claimed is:

1. An optoelectronic module comprising:
a carrier;
at least two semiconductor chips arranged at and/or in the carrier and serving for emitting electromagnetic radiation;
an emission unit arranged on or in the carrier and serving for emitting electromagnetic radiation from the optoelectronic module, wherein at least one of the semiconductor chips is spaced apart from the emission unit, and wherein the emission unit has at least one semiconductor chip; and
a waveguide, which guides the electromagnetic radiation of the at least one spaced-apart semiconductor chip to the emission unit, wherein the emission unit has a coupling-out structure for coupling out the electromagnetic radiation from the waveguide, wherein a radiation emission surface of the semiconductor chip in the emission unit and an exit window of the waveguide have an overlap.

2. The optoelectronic module according to claim 1, wherein the carrier comprises silicon or a ceramic material.

3. The optoelectronic module according to claim 1, wherein the spaced-apart semiconductor chip is an AlInGaP semiconductor chip that emits electromagnetic radiation, in particular in the red spectral range.

4. The optoelectronic module according to claim 1, wherein the waveguide at least regionally is buried in the carrier.

5. The optoelectronic module according to claim 1, wherein the waveguide at least regionally is arranged on the surface of the carrier.

6. The optoelectronic module according to claim 1, wherein the optoelectronic module has a coupling-in structure, in particular a prism or a thin-film multilayer filter, which couples the electromagnetic radiation of the spaced-apart semiconductor chip into the waveguide.

7. The optoelectronic module according to claim 1, wherein the spaced-apart semiconductor chip at least partly is buried in the carrier or is arranged on one of the two cover surfaces of the carrier.

8. The optoelectronic module according to claim 1, wherein the semiconductor chips are embodied as surface emitters, in particular as substrateless semiconductor chips.

9. The optoelectronic module according to claim 1, wherein the waveguide comprises dispersed conversion particles.

10. The optoelectronic module according to claim 1, wherein the coupling-out structure has a roughening of the surface of the waveguide.

11. The optoelectronic module according to claim 1, wherein the coupling-out structure comprises a prism.

12. The optoelectronic module according to claim 1, wherein the coupling-out structure comprises scattering particles.

13. The optoelectronic module according to claim 1, wherein the coupling-out structure is integrated into the waveguide.

14. The optoelectronic module according to claim 1, wherein a distance between the spaced-apart semiconductor chips and the emission unit is minimally double the edge length of the spaced-apart semiconductor chip, preferably minimally triple the edge length of the spaced-apart semiconductor chip, and in particular has the following values:
given an edge length of approximately 0.5 mm, minimally approximately 1 mm, preferably minimally approximately 1.5 mm;
given an edge length of approximately 1 mm, minimally approximately 2 mm, preferably minimally approximately 3 mm; and
given an edge length of approximately 2 mm, minimally approximately 4 mm, preferably minimally approximately 6 mm.

15. The optoelectronic module according to claim 1, wherein a distance between the spaced-apart semiconductor chips and the emission unit is maximally sixty times the edge length of the spaced-apart semiconductor chip, preferably maximally thirty times the edge length of the spaced-apart semiconductor chip, and in particular has the following values:
given an edge length of approximately 0.5 mm, maximally approximately 30 mm, preferably maximally approximately 15 mm;
given an edge length of approximately 1 mm, maximally approximately 60 mm, preferably maximally approximately 30 mm; and
given an edge length of approximately 2 mm, maximally approximately 120 mm, preferably approximately 60 mm.

16. A method for producing an optoelectronic module comprising the following steps:
providing a carrier;
arranging at least two semiconductor chips for emitting electromagnetic radiation at and/or in the carrier;
arranging an emission unit for emitting electromagnetic radiation from the optoelectronic module on or in the carrier, wherein at least one of the semiconductor chips is spaced apart from the emission unit, and wherein the emission unit has at least one semiconductor chip; and
arranging a waveguide on and/or in the carrier, wherein the waveguide guides the electromagnetic radiation of the at least one spaced-apart semiconductor chip to the emission unit, wherein a coupling-out structure for coupling out the electromagnetic radiation from the waveguide is arranged in the emission unit, wherein a radiation emission surface of the semiconductor chip in the emission unit and an exit window of the waveguide have an overlap.

17. An optoelectronic module comprising:
a carrier;
at least two semiconductor chips arranged at and/or in the carrier and serving for emitting electromagnetic radiation;
an emission unit arranged on or in the carrier and serving for emitting electromagnetic radiation from the optoelectronic module, wherein at least one of the semiconductor chips is spaced apart from the emission unit, and wherein the emission unit has at least one semiconductor chip; and
a waveguide, which guides the electromagnetic radiation of the at least one spaced-apart semiconductor chip to the emission unit, wherein the emission unit has a coupling-out structure for coupling out the electromagnetic radiation from the waveguide, wherein a radiation emission surface of the semiconductor chip in the emission unit and an exit window of the waveguide are arranged in a manner adjoining one another or have an overlap, wherein the waveguide at least regionally is buried in the carrier, and wherein the spaced-apart semiconductor chip is arranged on one of the two cover surfaces of the carrier.

* * * * *